(12) United States Patent
Koo et al.

(10) Patent No.: US 9,728,593 B2
(45) Date of Patent: Aug. 8, 2017

(54) ORGANIC LIGHT EMITTING DISPLAY DEVICE

(71) Applicant: Samsung Display Co., Ltd., Yongin, Gyeonggi-Do (KR)

(72) Inventors: Hyun Woo Koo, Hwaseong-si (KR); Tae Woong Kim, Yongin-si (KR); Young Gug Seol, Hwaseong-si (KR)

(73) Assignee: SAMSUNG DISPLAY CO., LTD, Gyeonggi-Do (KR)

( * ) Notice: Subject to any disclaimer, the term of this patent is extended or adjusted under 35 U.S.C. 154(b) by 0 days.

(21) Appl. No.: 14/515,697

(22) Filed: Oct. 16, 2014

(65) Prior Publication Data

US 2015/0179722 A1    Jun. 25, 2015

(30) Foreign Application Priority Data

Dec. 19, 2013 (KR) .................. 10-2013-0159625

(51) Int. Cl.
*H01L 27/32* (2006.01)
*H01L 51/52* (2006.01)
*H01L 51/00* (2006.01)

(52) U.S. Cl.
CPC ...... *H01L 27/3258* (2013.01); *H01L 51/5253* (2013.01); *H01L 51/0097* (2013.01); *H01L 2251/5338* (2013.01)

(58) Field of Classification Search
CPC ....... H01L 2227/326; H01L 2251/5338; H01L 2251/558; H01L 27/3244; H01L 51/003; H01L 51/5253

USPC .............................. 257/E51.018, 59; 438/28
See application file for complete search history.

(56) References Cited

U.S. PATENT DOCUMENTS

| 8,001,711 | B2 | 8/2011 | LaFarre et al. |
| 8,465,795 | B2 * | 6/2013 | Lujan .................. H01L 27/1218 427/374.1 |
| 2003/0077453 | A1 * | 4/2003 | Oaku ................ B32B 17/10036 428/415 |
| 2009/0096965 | A1 * | 4/2009 | Nagata .............. G02F 1/133305 349/103 |
| 2010/0308335 | A1 * | 12/2010 | Kim .................... H01L 27/3244 257/59 |

FOREIGN PATENT DOCUMENTS

| JP | 2011-027822 A | 2/2011 |
| JP | 5174781 B2 | 1/2013 |
| KR | 1020100130898 A | 12/2010 |
| KR | 1020110106539 A | 9/2011 |
| KR | 10-1238214 B1 | 2/2013 |

* cited by examiner

*Primary Examiner* — Edward Chin
(74) *Attorney, Agent, or Firm* — Cantor Colburn LLP

(57) ABSTRACT

An organic light emitting display device includes: a curved organic light emitting display panel. The organic light emitting display panel includes a flexible substrate, a thin film transistor layer including a semiconductor layer, and an organic light emission layer including an organic light emitting material. In the curved organic light emitting display panel, the thin film transistor layer receives a compressive stress, or a neutral plane in which the compressive stress and a tensile stress maintain equilibrium is defined in the thin film transistor layer.

18 Claims, 15 Drawing Sheets

FIG. 8

| # of bending | Vth (V) from Gm_max | | |
|---|---|---|---|
| | Vth | Vth0 | △Vth |
| Initial | -4.775 | -4.775 | 0.000 |
| 100k | -4.989 | -4.775 | -0.213 |
| 100k + vdsstress | -4.982 | -4.775 | -0.207 |

Sample condition : r = 5 mm, cyclic (100k) folding, W/L = 7/20, compressive stress
Channel direction : Vertical

FIG. 9

| # of bending | Vth (V) from Gm_max | | |
|---|---|---|---|
| | Vth | Vth0 | △Vth |
| Initial | -4.934 | -4.934 | 0.000 |
| 100k + vdsstress | -5.539 | -4.934 | -0.605 |

Sample condition : r = 5 mm, cyclic (100k) folding,
W/L = 7/20, tensile stress
Channel direction : Vertical

FIG. 10

| PET | | Dummy PET 23um |
|---|---|---|
| | | PSA 50um |
| | TFT | Double PI+TFT 24.8um |
| PI | | PSA 25um |
| PET | | PET 75um |

ORGANIC LIGHT EMITTING DISPLAY DEVICE

This application claims priority to Korean Patent Application No. 10-2013-0159625 filed on Dec. 19, 2013, and all the benefits accruing therefrom under 35 U.S.C. §119, the entire contents of which are incorporated herein by reference.

BACKGROUND (a) Field

The invention relates to an organic light emitting display device. More particularly, the invention relates to an organic light emitting display device which is bendable.

(b) Description of the Related Art

A display field has been rapidly developed for various information transfer means in modern society, and many technical challenges exist in terms of weight and thickness of a display and provide challenges to move away from flat-panel light emission of the display.

Among flat panel displays, a liquid crystal display ("LCD") has been most widely used, and since the LCD is a non-emissive display device, there is a drawback in that the LCD includes a separate light source such as a backlight.

An organic light emitting diode ("OLED") that is a self-luminous display device has received attention. The OLED includes two electrodes (e.g., anode and cathode) facing each other, and an organic layer (e.g., a light emitting layer) interposed between the electrodes. In the OLED, if holes injected from an anode and electrons injected from a cathode meet each other at a light emitting layer to generate an exciton and the exciton is subjected to photo-luminescence quenching, light is generated. The OLED may be applied to various fields including a display device and a lighting device.

SUMMARY

In an organic light emitting display device, a bendable display device can be configured by using a flexible substrate. Where the display device is bended, in each layer within the organic light emitting display device, wiring may be disconnected and/or characteristics may be deteriorated due to stress from the bending.

One or more exemplary embodiment of the invention provides an organic light emitting display device that can be bent without deterioration of characteristics thereof.

An exemplary embodiment of the invention provides a curved organic light emitting display device including an organic light emitting display panel. The organic light emitting display panel includes a flexible substrate, a thin film transistor layer including a semiconductor layer, and an organic light emission layer including an organic light emitting material. In the curved organic light emitting display panel, the thin film transistor layer receives a compressive stress, or a neutral plane in which the compressive stress and a tensile stress maintain equilibrium is defined in the thin film transistor layer including the semiconductor layer.

The flexible substrate or the organic light emission layer may receive tensile stress.

The organic light emitting display device may further include a first protective film at an upper portion of the organic light emitting display panel, and a first adhesive layer may be between the first protective film and the organic light emitting display panel and attach the first protective film to the organic light emitting display panel.

The first protective film or the first adhesive layer may receive the tensile stress.

The organic light emitting display device may further include a second protective film at a lower portion of the organic light emitting display panel, and a second adhesive layer may be between the second protective film and the organic light emitting display panel and attach the second protective film to the organic light emitting display panel.

The second protective film or the second adhesive layer may receive the tensile stress.

The thin film transistor layer may include a thin film transistor including the semiconductor layer, and the thin film transistor layer may be between the organic light emission layer and the flexible substrate.

The organic light emission layer may receive the tensile stress.

The organic light emitting display panel may further include an encapsulation layer which covers the organic light emission layer.

The encapsulation layer may receive the tensile stress.

The organic light emitting display panel may further include a barrier layer between the flexible substrate and the thin film transistor layer.

The barrier layer may receive the tensile stress.

The organic light emitting display panel may further include an insulating layer including an inorganic material.

The inorganic insulating layer may receive the compressive stress, or the neutral plane in which the compressive stress and the tensile stress maintain equilibrium may be defined in the inorganic insulating layer.

The organic light emitting display panel may further include an organic insulating layer including an organic material.

The organic insulating layer may receive the tensile stress.

In accordance with one or more exemplary embodiment of the invention, deterioration of display quality caused by a bending operation may be reduced or effectively prevented, by not locating important layers such as the thin film transistor layer of the organic light emitting display device at the region to which the tensile stress is applied.

BRIEF DESCRIPTION OF THE DRAWINGS

The above and other features of this disclosure will become more apparent by describing in further detail, exemplary embodiments thereof with reference to the accompanying drawings, in which:

FIG. 4 to FIG. 9 show results of tests performed with an exemplary embodiment of an organic light emitting display device of the invention.

FIG. 10 to FIG. 13 show results of more tests performed with the exemplary embodiment of the organic light emitting display device of the invention.

DETAILED DESCRIPTION

Figure 1:
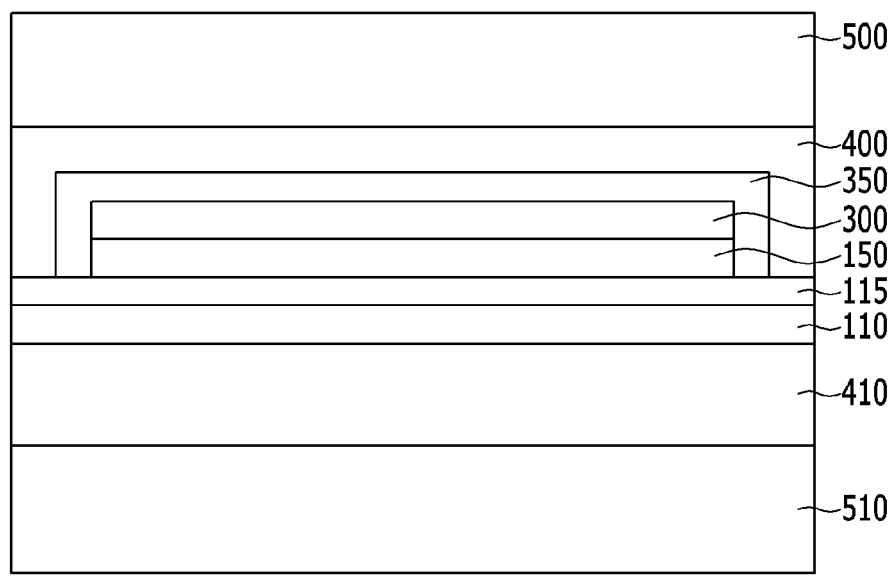
FIG. 1 is a cross-sectional view showing an exemplary embodiment of an organic light emitting display device in accordance with the invention.

Hereinafter, exemplary embodiments of the invention will be described in detail with reference to the accompanying drawings. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "below," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an exemplary embodiment of an organic light emitting display device in accordance with the invention will be described in detail with reference to FIG. 1.

FIG. 1 is a cross-sectional view showing an exemplary embodiment of the organic light emitting display device in accordance with the invention.

As shown in FIG. 1, the organic light emitting display device includes organic light emitting display panel layers 110, 115, 150, 300 and 350, a first protective film 500 provided at an upper portion of the organic light emitting display panel layers and attached thereto by using a first adhesive layer 400, and a second protective film 510 attached thereto by using a second adhesive layer 410.

The organic light emitting display panel layers 110, 115, 150, 300 and 350 include a flexible substrate 110, a barrier layer 115, a thin film transistor layer 150, an organic light emission layer 300, and an encapsulation layer 350. The layers 110, 115, 150, 300 and 350 may collectively form an organic light emitting display panel, but the invention is not limited thereto. In an exemplary embodiment, the organic light emitting display panel may include more or less layers than those illustrated.

FIG. 1 schematically shows a cross-section of the organic light emitting display panel, but the actual cross-sectional structure is more complex.

As for the structure of the organic light emitting display panel, the organic light emitting display panel includes a plastic-like flexible substrate 110. An example of the material for the flexible substrate 110 representatively includes plastic, but the flexible substrate 110 may include various flexible materials. The barrier layer 115 is provided on the flexible substrate 110. The barrier layer 115 may include an inorganic insulating material. Where the barrier layer 115 includes an inorganic insulating material, the barrier layer 115 may be an inorganic insulating layer.

The thin film transistor layer 150 may include a semiconductor layer and is disposed on the barrier layer 115. The thin film transistor layer 150 is shown as a single layer structure in FIG. 1, but may actually include a plurality of layers including the semiconductor layer, a gate layer, a source layer, a drain layer, and other insulating layers (e.g., a gate insulating layer and an interlayer insulating layer). Among these layers, in accordance with an exemplary embodiment, the semiconductor layer is disposed on the barrier layer 115, and a gate insulating layer is disposed thereon. A gate electrode is disposed on the gate insulating layer. An interlayer insulating layer is disposed on the gate electrode, and a source electrode and drain electrode are disposed on the interlayer insulating layer. Contact holes may be defined in the interlayer insulating layer and/or the gate insulating layer and may expose a source region and a drain region of the semiconductor layer. The source electrode and the drain electrode are respectively connected to the source region and the drain region of the semiconductor layer, via respective contact holes. Herein, the gate insulating layer and the interlayer insulating layer may include an inorganic insulating material.

The barrier layer 115 may serve to protect the flexible substrate 110 and/or the thin film transistor layer 150, particularly the semiconductor layer, against impurities from the flexible substrate 110 when the thin film transistor layer 150 is formed on the flexible substrate 110 in an exemplary embodiment of manufacturing the organic light emitting display device.

The thin film transistor layer 150 may have various structures, and may include a plurality of thin film transistors per pixel.

The organic light emission layer 300 is provided on the thin film transistor layer 150. A discrete organic light emission layer 300 may be provided per pixel, and each pixel may be divided by a pixel defining film (not shown), but the invention is not limited thereto. An opening may be defined in the pixel defining film, and the organic light emission layer 300 may be provided in the opening.

The organic light emission layer 300 may include an organic light emitting material, and the pixel defining film may include an organic material.

An organic insulating layer (not shown) including an organic material may be provided between the thin film transistor layer 150 and the organic light emission layer 300.

Characteristics of the organic light emission layer 300 are deteriorated due to external moisture. Accordingly, the encapsulation layer 350 blocks the external moisture from reaching the organic light emission layer 300 to protect the organic light emission layer 300. The encapsulation layer 350 may include an organic material. The encapsulation layer 350 may have a multi-layered structure, but the invention is not limited thereto. As layers, the encapsulation layer 350 may have a plurality of inorganic films, or a plurality of inorganic films and organic films.

Light is emitted from the organic light emission layer 300 by an electrical current that is supplied to the thin film transistor layer 150. In an exemplary embodiment, a common electrode (not shown) may be included between the organic light emission layer 300 and the encapsulation layer 350. With the common electrode, an electrical current flows between the common electrode and an electrode (e.g., a pixel electrode) of the thin film transistor layer 150.

The first protective film 500 and the second protective film 510 are respectively disposed at an upper portion and a lower portion of the collective organic light emitting display panel, and are attached thereto by the first adhesive layer 400 and the second adhesive layer 410, respectively. The first protective film 500 and second protective film 510 may include a flexible material such as plastic, to have a flexible characteristic similar to the flexible substrate 110.

In an exemplary embodiment, the first protective film 500 and/or the second protective film 510 may have a polarization function. A protective film having the polarization function may be disposed depending on a direction in which light is emitted from the organic light emission layer 300. Specifically, when the organic light emission layer 300 performs top emission, that is, when the organic light emission layer 300 emits light toward the first protective film 500 to display an image, the first protective film 500 has the polarization function. However, when the organic light emission layer 300 performs bottom emission, that is, when the organic light emission layer 300 emits light toward the second protective film 510 to display an image, the second protective film 510 has the polarization function. When the organic light emission layer 300 performs double-side emission (e.g., both top and bottom), the first protective film 500 and the second protective film 510 may both have the polarization function.

If only one of the first protective film 500 and the second protective film 510 has the polarization function, the other protective film includes substantially the same material in terms of physical properties, except for the polarization function. Here, having substantially the same physical properties refers to having very similar physical properties, although materials thereof may not be exactly the same. In an exemplary embodiment, both the first protective film 500 and the second protective film 510 may not have the polarization function.

The first adhesive layer 400 and second adhesive layer 410 may also have the same physical properties. The first adhesive layer 400 and second adhesive layer 410 have relatively smooth, soft and pliable qualities compared with those of the first protective film 500, the second protective film 510, the flexible substrate 110 and the encapsulation layer 350.

When the organic light emitting display device has the structure as shown in FIG. 1, a compressive stress is applied to a part thereof, a tensile stress is applied to another part, and a natural plane exists therebetween. The natural plane serves as a plane to which no stress is applied since the compressive stress and the tensile stress maintain equilibrium. Such natural plane may also be referred to as a neutral plane.

For the inorganic material, a large opposing force is generated against the compressive stress, while a small opposing force is generated against the tensile stress. In other words, when the tensile stress is applied to a layer including the inorganic material, a crack is generated between portions of the inorganic material. However, when the compressive stress is applied to a layer including the inorganic material, no large problem such as a crack is generated. In contrast, for the organic material, a force opposing the tensile stress is relatively large, unlike the inorganic material. Accordingly, even when the tensile stress is generated, the organic material is extended to some degree, thereby reducing or effectively preventing film characteristic deterioration owing to the characteristic of the organic material. The semiconductor layer included in the thin film transistor layer has a characteristic that is similar to that of the inorganic material.

Accordingly, in one or more exemplary embodiment of the organic light emitting display device of the invention, a layer including the inorganic material or a layer including the semiconductor layer is located at the neutral plane or at a region to which the compressive stress is applied. In contrast, a layer including the organic material, a substrate, a film, an adhesive layer and the like is located at a region to which the tensile stress is applied. Since a layer including the inorganic material or a layer including the organic material has an opposing force of a specific level against the compressive stress, a portion of a collective layered structure to which the tensile stress is applied is first considered before a portion to which the compressive stress is applied is considered.

In the illustrated exemplary embodiment, the thin film transistor layer 150 may be taken as a representative layer including the inorganic material. Accordingly, the thin film transistor layer 150 is located at the neutral plane or at a region to which the compressive stress is applied. Since the organic light emission layer 300 includes the organic material, the organic light emission layer 300 may be affected by the tensile stress and the compressive stress.

Hereinafter, the characteristic of various layers depending on a bendable direction of a collective layered structure will be described with reference to FIG. 2 and FIG. 3.

Figure 2:
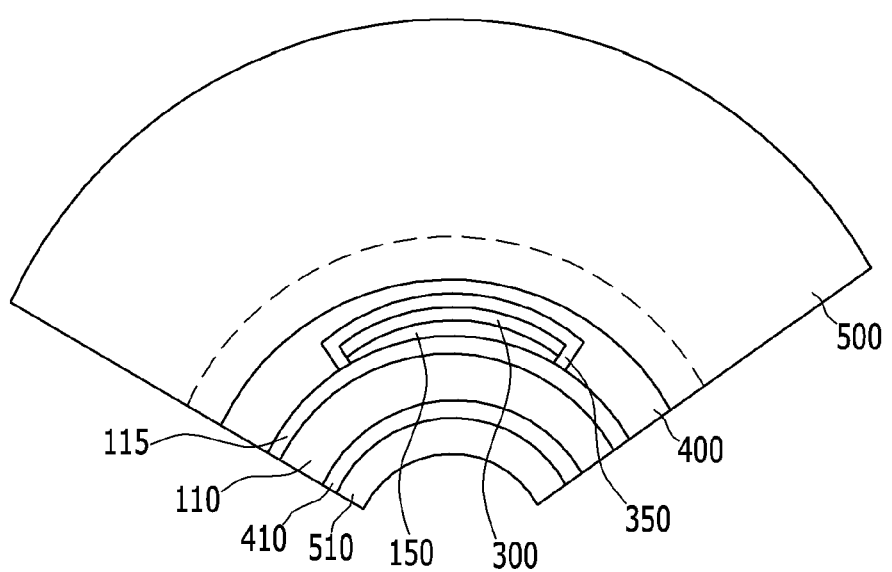
FIG. 2 and FIG. 3 are cross-sectional views showing relative thicknesses of layers according to bendable directions of an exemplary embodiment of an organic light emitting display device in accordance with the invention.
Figure 3:
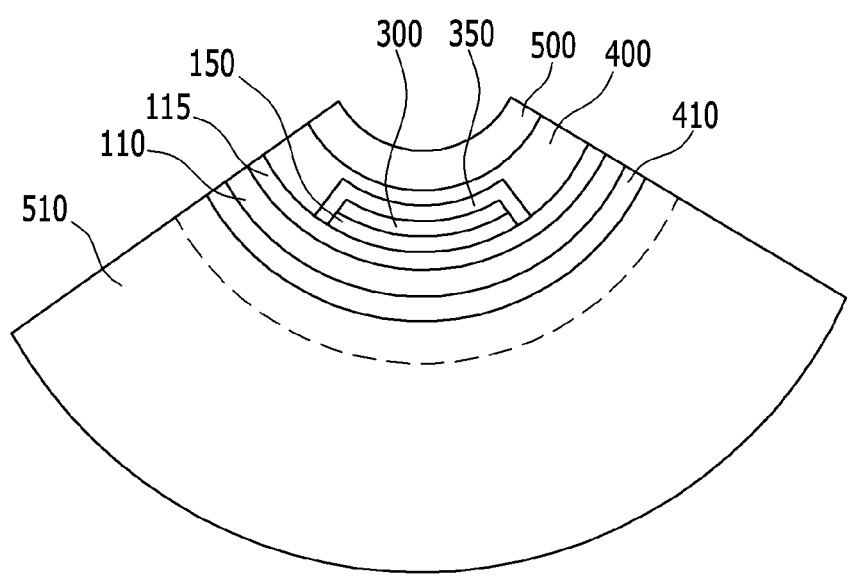

FIG. 2 and FIG. 3 are cross-sectional views showing relative thicknesses of layers according to bendable directions of an exemplary embodiment of the organic light emitting display device in accordance with the invention.

A flexible organic light emitting display device is bendable in both the directions shown in FIG. 2 and FIG. 3. However, exemplary embodiments in which a curved bent state is maintained depending on bendable directions will be described.

First, the flexible substrate 110 which is protruded toward an upper portion thereof and bent as shown in FIG. 2 will be described.

As shown in FIG. 2, a tensile stress is applied to the layers located at an upper portion of the organic light emitting display device, while a compressive stress is applied to the layers located at a lower portion thereof. The neutral plane in which the compressive stress and the tensile stress maintain equilibrium is indicated by a dotted line in FIG. 2. The maximum tensile stress is applied at the upper portion and the maximum compressive stress is applied at the lower portion. In a relative sense, as layers are located closer to the upper portion, more tensile stress and less compressive stress is applied thereto, while layers located closer to the lower portion are applied with relatively less tensile stress and more compressive stress.

In FIG. 2, the neutral plane is located within the first protective film 500. In the exemplary embodiment of FIG. 2, the tensile stress is effectively applied to only the first protective film 500, and the compressive stress is applied to other remaining layers. Since the first protective film 500 is a film, the opposing force thereof against the tensile stress is sufficient so as to resist cracks or other defects. Accordingly, although bending of the layered structure in FIG. 2 is performed several tens of thousands of times, the display quality of the organic light emitting display device is not deteriorated.

In an alternative exemplary embodiment different from the exemplary embodiment of FIG. 2, even when the neutral plane is located in the first adhesive layer 400, the encapsulation layer 350 or the organic light emission layer 300, the force opposing the tensile stress is generated and may be sufficient so as to resist cracks or other defects, thereby reducing or effectively preventing deterioration of the display quality.

However, when the neutral plane is located in the thin film transistor layer 150, a crack is generated therein, e.g., the inorganic insulating layer included in the thin film transistor layer 150, thereby deteriorating the display quality of the organic light emitting display device and changing the characteristics of the thin film transistor.

As a result, where the flexible substrate 110 is protruded toward the upper portion thereof and bent as shown in FIG. 2, the neutral plane may be located in a layer that is located above (e.g., in the upper direction from) the thin film transistor layer 150.

As described above, where the collective layered structure is bent to be convex toward the upper portion, the position of the neutral plane may be changed depending on the cross-sectional thickness and material of each layer. Under the assumption that the material of each layer is unchanged, the position of the neutral plane can be controlled by adjusting the cross-sectional thickness of each layer. Where the collective layered structure is bent toward the upper portion, the neutral plane can be located at a further upper portion by increasing the cross-sectional thickness of a layer that is located above the thin film transistor layer 150. The organic light emitting display panel may have a determined overall cross-sectional thickness and by using various materials. Accordingly, in an exemplary embodiment, the neutral plane can be located at the further upper portion by increasing the cross-sectional thickness of the first adhesive layer 400 and/or the first protective film 500.

Moreover, the position of the neutral plane may be changed depending on a bending degree of the organic light emitting display device, and thus the position of the neutral plane can be determined in consideration of the bending degree with respect to a viewpoint of a user.

Next, the flexible substrate 110 which is protruded toward a lower portion thereof and bent as shown in FIG. 3 will be described.

As shown in FIG. 3, a compressive stress is applied to the layers located at an upper portion of the organic light emitting display device, while a tensile stress is applied to the layers located at a lower portion thereof. The neutral plane in which the compressive stress and the tensile stress maintain equilibrium is indicated by a dotted line in FIG. 3. The maximum compressive stress is applied at the upper portion and the maximum tensile stress is applied at the lower portion. In a relative sense, as layers are located closer to the lower portion, more tensile stress and less compressive stress is applied thereto, while layers located closer to the upper portion are applied with relatively less tensile stress and more compressive stress.

In FIG. 3, the neutral plane is located within the second protective film 510. In the exemplary of FIG. 3, the tensile stress is effectively applied only to the second protective film 510, and the compressive stress is applied to other remaining layers. Since the second protective film 510 is a film, the opposing force thereof against the tensile stress is sufficient so as to resist cracks or other defects. Accordingly, although bending of the layered structure in FIG. 3 is performed several tens of thousands of times, the display quality of the organic light emitting display device is not deteriorated In an alternative exemplary embodiment different from the exemplary embodiment of FIG. 3, even when the neutral plane is located in the second adhesive layer 410, the flexible substrate 110 or the barrier layer 115, the force opposing the tensile stress is generated and may be sufficient so as to resist cracks or other defects, thereby reducing or effectively preventing deterioration of the display quality.

However, when the neutral plane is located in the thin film transistor layer 150, a crack is generated therein, e.g., the inorganic insulating layer included in the thin film transistor layer 150, thereby deteriorating the display quality of the organic light emitting display device and changing the characteristics of the thin film transistor.

As a result, where the flexible substrate 110 is protruded toward the lower portion thereof and bent as shown in FIG. 3, the neutral plane may be located in a layer that is located below (e.g., in the lower direction from) the thin film transistor layer 150.

As described above, where the collective layered structure is bent to be convex toward the lower portion, the position of the neutral plane may be changed depending on the cross-sectional thickness and material of each layer. Under the assumption that the material of each layer is unchanged, the position of the neutral plane can be controlled by adjusting the cross-sectional thickness of each layer. Where the collective layered structure is bent toward the lower portion, the neutral plane can be located at a further lower portion by increasing the cross-sectional thickness of a layer that is located below the thin film transistor layer 150. The organic light emitting display panel may have a determined overall cross-sectional thickness and by using various materials. Accordingly, in an exemplary embodiment, the neutral plane can be located at the further lower portion by increasing the cross-sectional thickness of the second adhesive layer 410 and/or the second protective film 510.

Moreover, the position of the neutral plane may be changed depending on a bending degree of the organic light emitting display device, and thus the position of the neutral plane can be determined in consideration of the bending degree with respect to a viewpoint of a user.

Hereinafter, how characteristics of the thin film transistor layer 150 of the organic light emitting display device are changed depending on the tensile stress and the compressive stress will be described through tests.

First, results of tests of FIG. 4 to FIG. 9 will be described.

FIG. 4 to FIG. 9 show results of the tests performed by using an exemplary embodiment of an organic light emitting display device of the invention.

Figure 4:
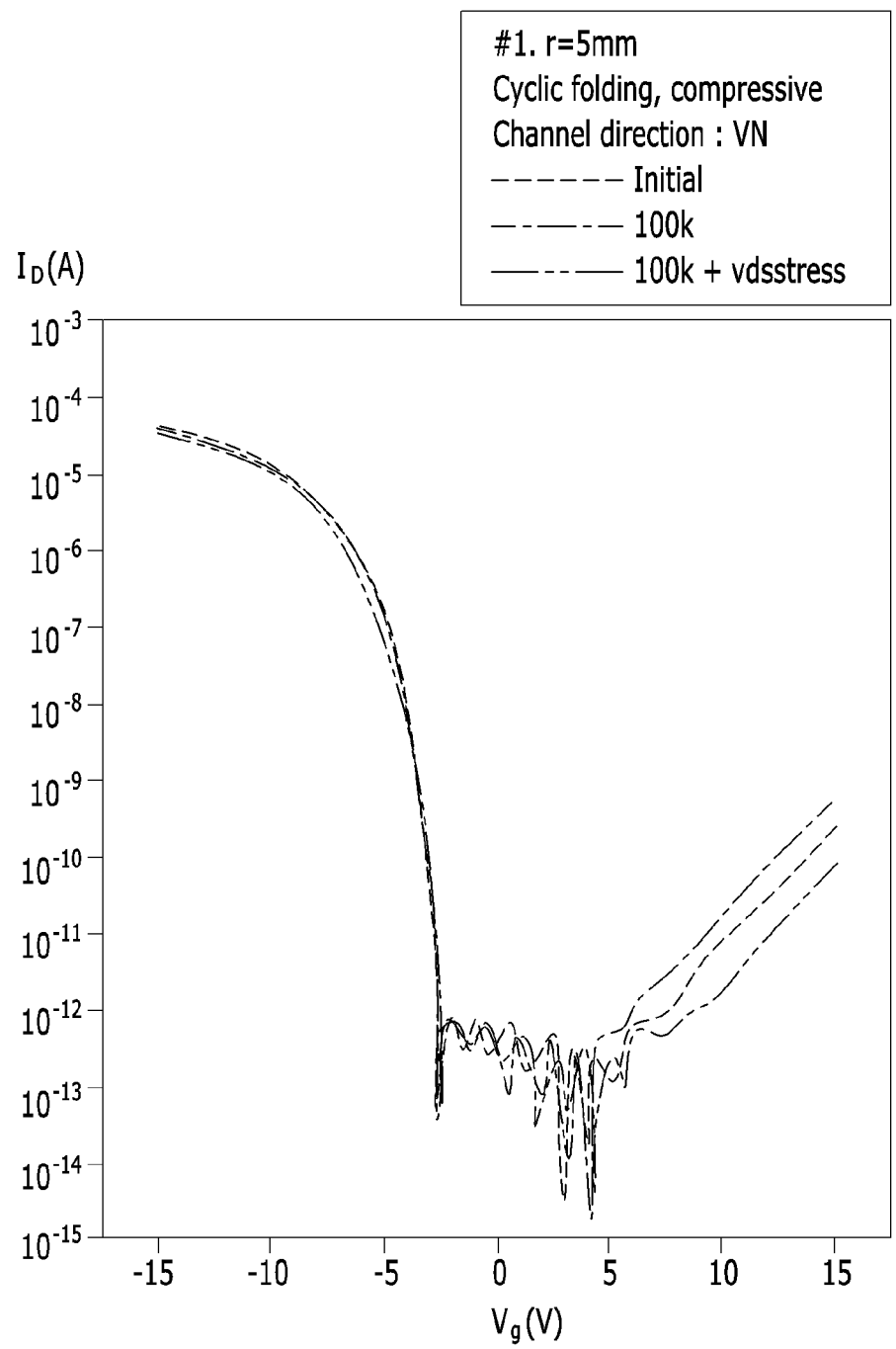
Figure 5:
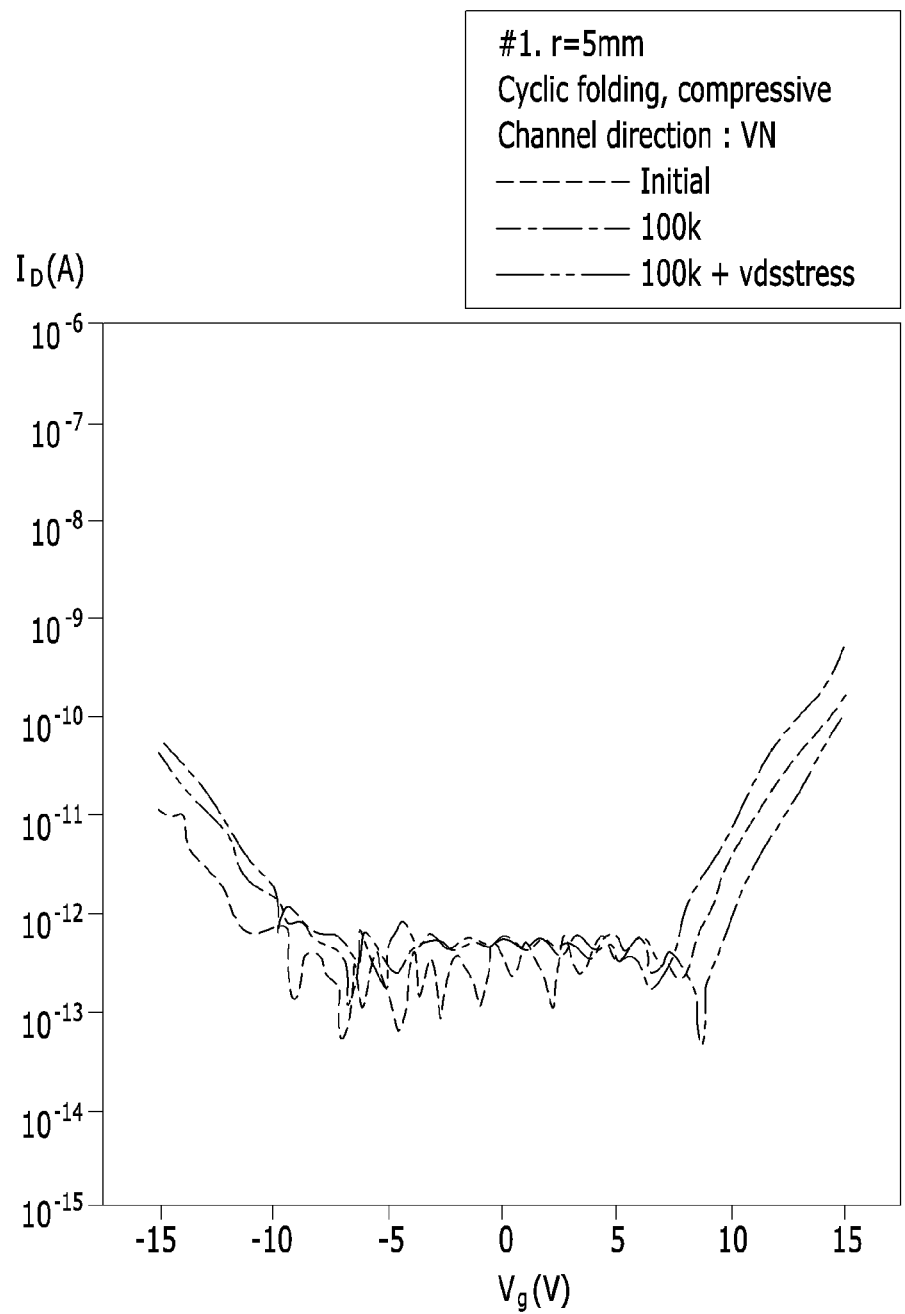
Figure 6:
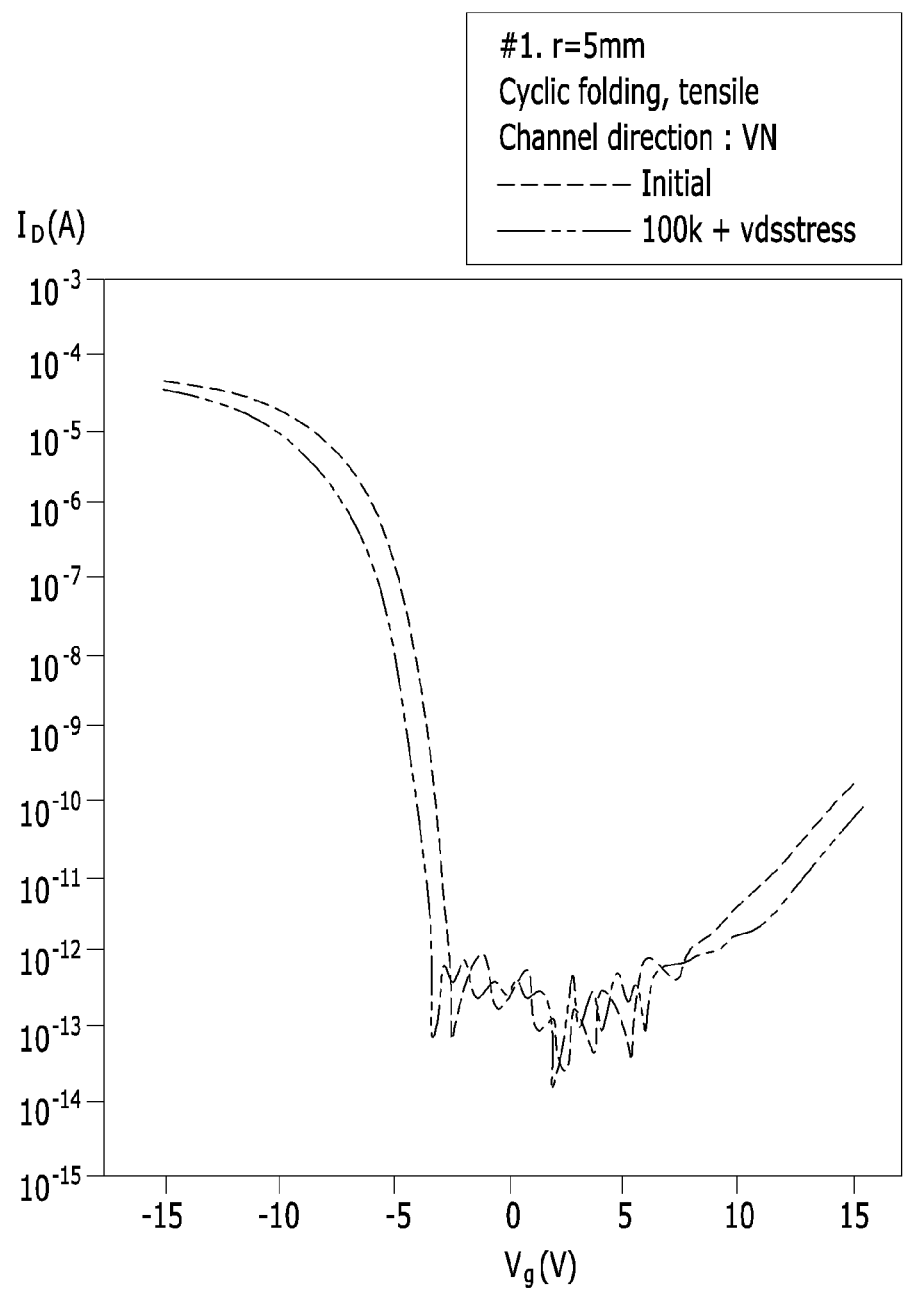
Figure 7:
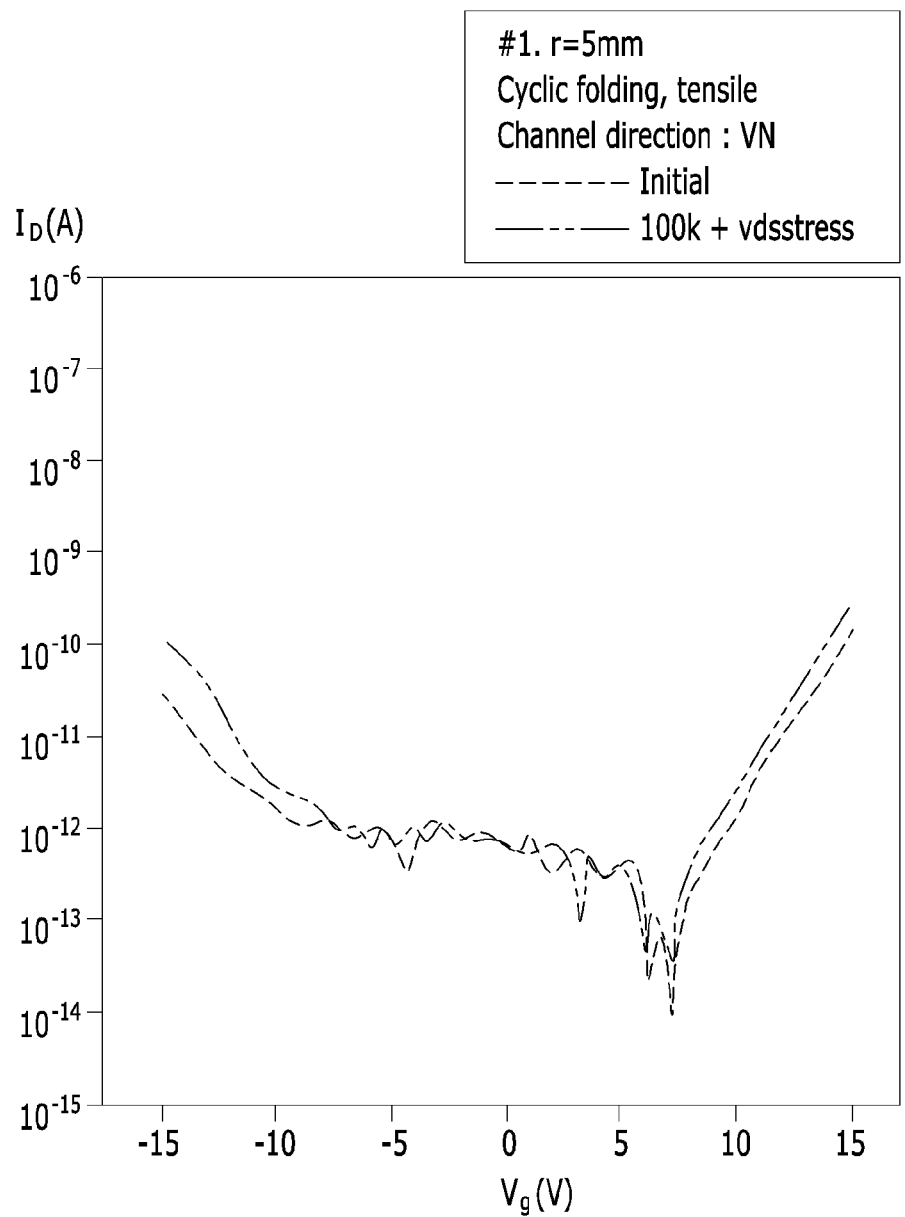

The tests of FIG. 4 to FIG. 9 are roughly divided into the tests of FIG. 4 and FIG. 5 and the tests of FIG. 6 and FIG. 7. FIG. 4 and FIG. 5 shows how the characteristic of a thin film transistor is changed depending on a compressive stress, and FIG. 6 and FIG. 7 shows how the characteristic of a thin film transistor is changed depending on a tensile stress.

In the tests of FIG. 4 to FIG. 7, the characteristic of the thin film transistor was tested after the exemplary embodiment of the organic light emitting display device was bent with a curvature radius (r) of about 5 millimeters (mm) one hundred thousand times (100 k). The thin film transistor used herein includes a polycrystalline semiconductor which was manufactured by a low temperature poly silicon ("LTPS") method. A ratio of width (W) and length (L) of a channel of the thin film transistor used in the tests is 7:20 (see FIG. 8 or FIG. 9).

First, the tests of FIG. 4 and FIG. 5 will be described.

In FIG. 4 and FIG. 5, the horizontal axis indicates a gate voltage Vg in volts (V), and the vertical axis indicates an electrical current ($I_D$) in amperes (A) flowing in the channel. FIG. 4 and FIG. 5 show electrical current values measured in different directions in the same channel of the thin film transistor.

Each of FIG. 4 and FIG. 5 shows an initial characteristic of the thin film transistor (Initial), a characteristic of the thin film transistor which was bent one hundred thousand times (100 k), and a characteristic of the thin film transistor to which a voltage stress was additionally applied after it was bent one hundred thousand times (100 k+Vsd stress). Herein, the reason to apply the voltage stress is for higher reliability of the test results.

From FIG. 4 and FIG. 5, it is shown that the characteristic of the thin film transistor is slightly changed, but a substantially constant characteristic is obtained when the voltage of −3 V or lower in FIG. 4.

Similarly, in FIG. 6 and FIG. 7, the horizontal axis indicates a gate voltage Vg, and the vertical axis indicates an electrical current flowing in the channel. FIG. 6 and FIG. 7 show electrical current values measured in different directions in the same channel of the thin film transistor. FIG. 6 corresponds to FIG. 4, and FIG. 7 corresponds to FIG. 5.

Each of FIG. 6 and FIG. 7 shows an initial characteristic of the thin film transistor (Initial) and a characteristic of the thin film transistor to which a voltage stress was additionally applied after it was bent one hundred thousand times (100 k+Vsd stress). Herein, the reason to apply the voltage stress is for higher reliability of the test results.

From FIG. 6 and FIG. 7, it is shown that the characteristic of the thin film transistor, and the characteristic thereof is entirely shifted in FIG. 6.

FIG. 8 and FIG. 9 are tables showing the test results of FIG. 4 to FIG. 7. FIG. 8 represents results of applying the compressive stress and a difference (ΔVth) between threshold voltages Vth of the thin film transistor in the direction of FIG. 4, and FIG. 9 represents the results of applying the tensile stress and a difference between threshold voltages Vth of the thin film transistor in the direction of FIG. 6.

From FIG. 8 and FIG. 9, it is shown that the difference between the threshold voltages is about 0.2 V in FIG. 8, but the difference between the threshold voltages is about 0.6 V in FIG. 9, which is 3 times greater than that shown in FIG. 8.

As a result, it is possible to reduce deterioration of display quality by locating the thin film transistor at the region of a layered structure affected by the compressive stress instead of the tensile stress.

How the characteristic of the organic light emitting display device is changed when it is bent by 90° will be described with reference to FIG. 10 to FIG. 13 in order to examine the characteristic thereof in accordance with an exemplary embodiment of the invention.

FIG. 10 to FIG. 13 show more results of tests performed by using the exemplary embodiment of organic light emitting display device of the invention.

Herein, bending the layered structure of organic light emitting display device by 90° indicates bending or curving the layered structure such that the angle formed by opposite ends thereof is 90°, and specifically indicates that the corresponding portion is curvedly bent not by 90° but the angle of the opposite ends thereof is 90°

Where opposite ends of the layered structure form an angle of 90°, the tensile stress and the compressive stress applied to the layers are significantly increased. Accordingly, it is possible to recognize a larger characteristic change as compared with the tests of FIG. 4 to FIG. 9.

First, FIG. 10 shows a schematic structure of a layered structure used in this test.

As for the substrate shown in FIG. 10, a flexible substrate included polyimide ("PI"), and a first protective film and a second protective film included a polyester ("PET") film. A thin film transistor ("TFT") was provided on the PI layer, and a layer covering the TFT included PI. The PI layer and the first and second protective films PET were attached to each other by using a pressure sensitivity adhesive ("PSA") layer. The lower film, e.g., the second protective film (PET) had a cross-sectional thickness of 75 micrometers (μm), and the total thickness (Double PI+TFT) of the flexible substrate as collectively including the first PI layer and the second PI layer covering the TFT, was 24.8 μm. The lower adhesive layer, e.g., the second adhesive layer, was formed to have a thickness of 25 μm. The upper adhesive layer, e.g., the first adhesive layer, was formed to have a thickness of 50 μm, and the first protective film (Dummy PET) formed thereon had a thickness of 23 μm.

Figure 11:
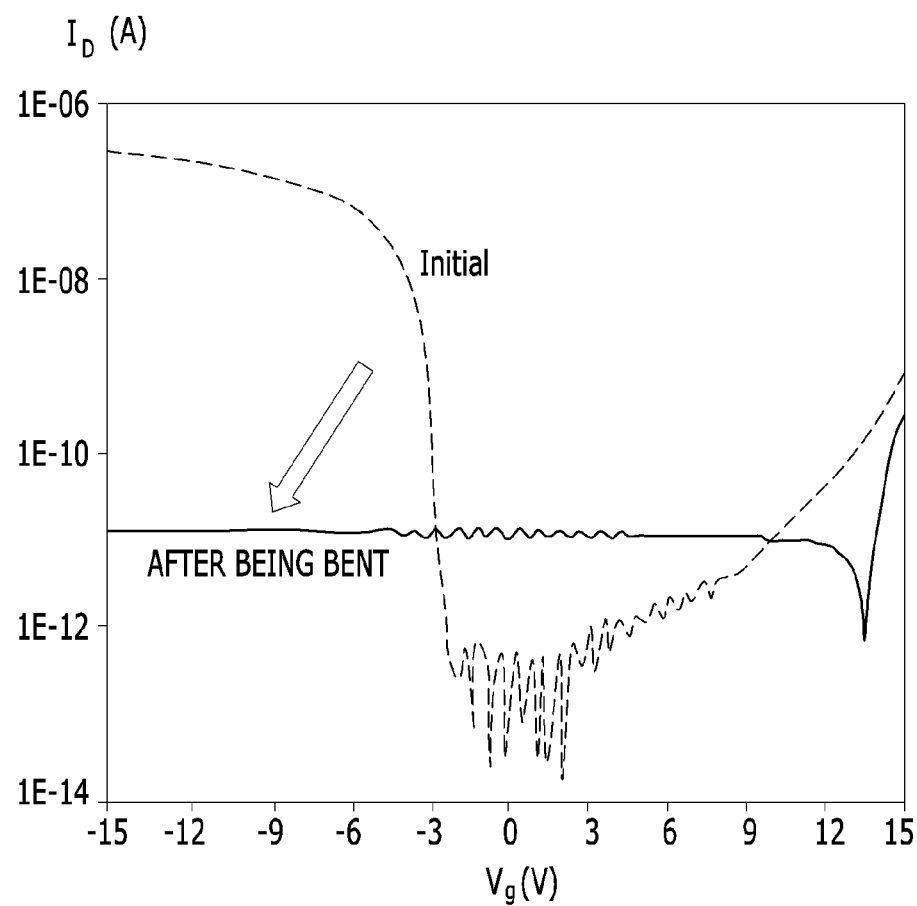
Figure 12:
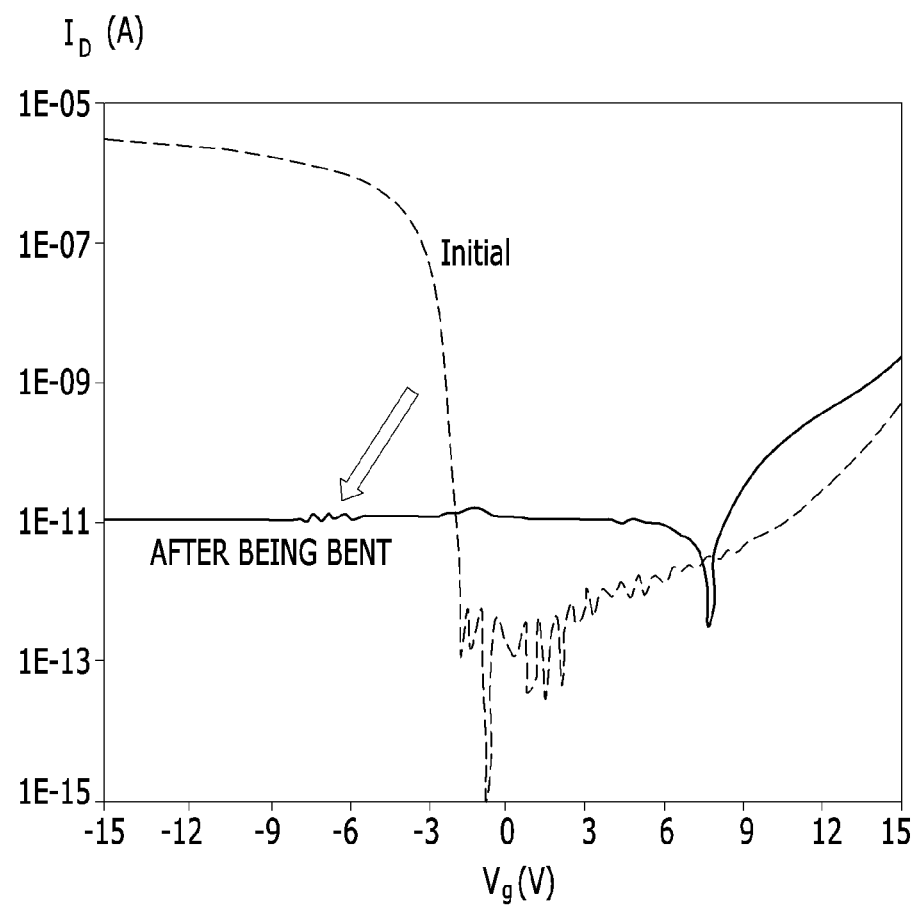
Figure 13:
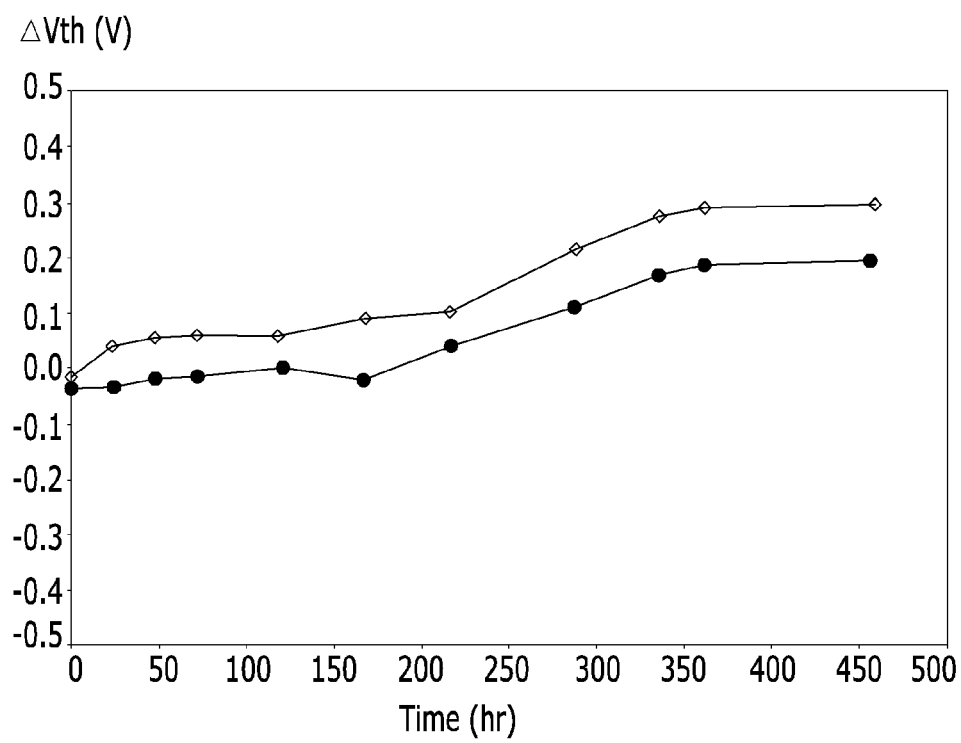

FIG. 11 to FIG. 13 show the characteristic of the thin film transistor after the flexible substrate was bent to position opposite ends thereof at 90° relative to each other.

First, FIG. 11 and FIG. 12 show how the characteristic of the thin film transistor is changed after the thin film transistor is bent by 90° to apply the tensile stress thereto. In FIG. 11 and FIG. 12, the horizontal axis indicates a gate voltage Vg, and the vertical axis indicates a current $I_D$ applied to the channel.

In FIG. 11 and FIG. 12, "initial" indicates a curve showing the characteristic of the thin film transistor before the thin film transistor is bent by 90°, and "after being bent" indicates a curve showing a curve showing the characteristic of the thin film transistor after the tensile stress is applied to the thin film transistor by bending it by 90°. FIG. 11 and FIG. 12 respectively are test graphs of two thin film transistors having different channel characteristics.

As shown in FIG. 11 and FIG. 12, when the tensile stress is applied, the two thin film transistors have different characteristics.

FIG. 13 is a graph of the thin film transistors which are bent by 90° to apply the compressive stress thereto. In FIG. 13, the horizontal axis indicates time in hours (hr), and the vertical axis indicates a variation ΔVth of the threshold voltage Vth of the thin film transistor. In FIG. 13, the two thin film transistors of FIG. 11 and FIG. 12 are represented in the graph of FIG. 13. The thin film transistor shown in FIG. 11 has a higher threshold voltage than that of the thin film transistor shown in FIG. 12.

From FIG. 13, it is shown that even when the compressive stress is applied, the threshold voltage is changed, but the variation of the threshold voltage is stably restricted to lower than 0.3 V even after 458 hours. As a result, the thin film transistor relatively has a force opposing the compressive stress.

Hereinafter, the characteristic of the thin film transistor according to the compressive stress and the tensile stress will be described with reference to FIG. 14 and FIG. 15.

Figure 14:
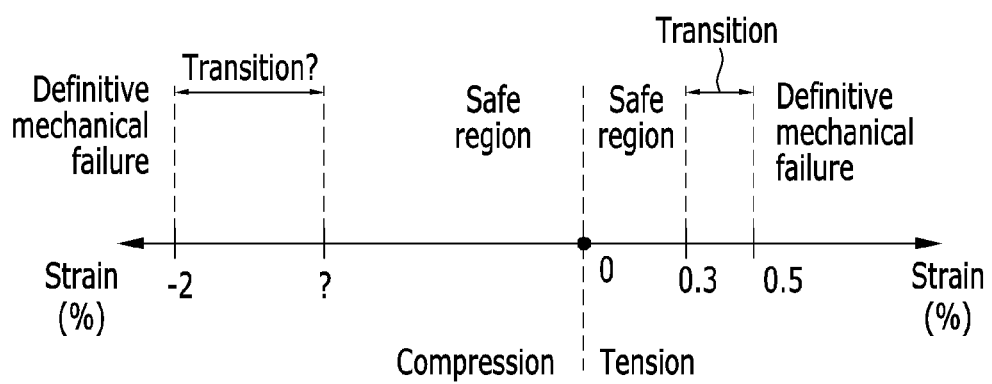
FIG. 14 and FIG. 15 are graphs comparing compressive stress and tensile stress in the exemplary embodiment of the organic light emitting display device of the invention.
Figure 15:
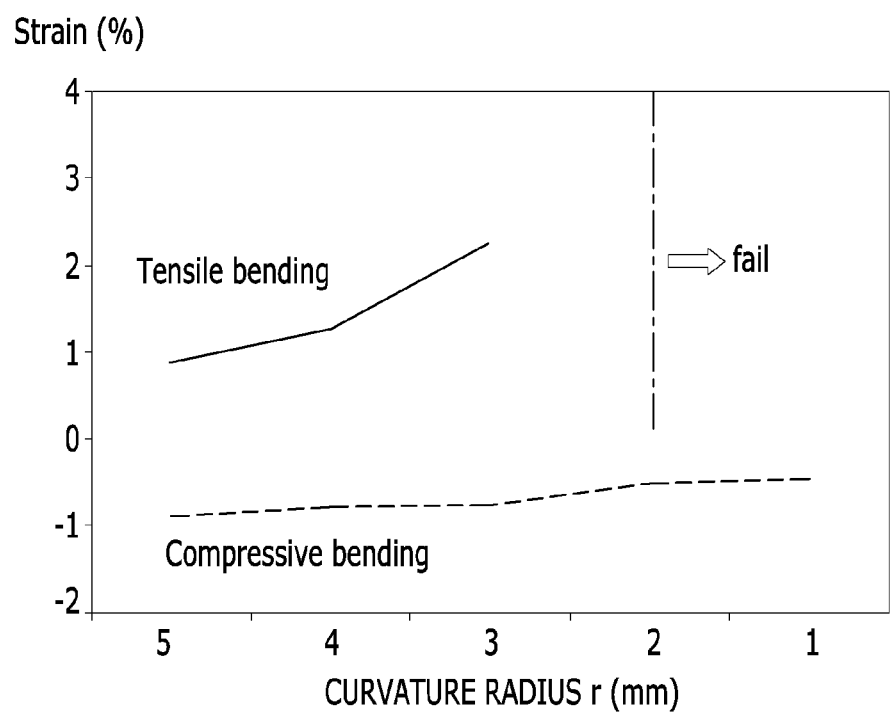

FIG. 14 and FIG. 15 are graphs comparing the compressive stress and the tensile stress in the exemplary embodiment of the organic light emitting display device of the invention.

First, In FIG. 14, how the characteristic of the thin film transistor is changed according to an applied strain in percent (%) is illustrated on a horizontal line.

In FIG. 14, a positive value (toward right) indicates applying a tensile stress, a negative value (towards left) indicates applying a compressive stress, and "0" indicates a neutral plane in which the compressive stress and the tensile stress maintain equilibrium. As shown in FIG. 14, the applied stress causes the characteristic of the thin film transistor to be varied, but the variation is not a problem when the variation is within a permissible error range (safe region). However, when the stress is increased, the characteristic of the thin film transistor is significantly varied, thereby causing failure in the operation of the thin film transistor in the worst case scenario (definitive mechanical failure). A transition exists between the safe region and the definitive mechanical failure.

From FIG. 14, it is shown that the size of the safe region is larger in applying the compressive stress than in applying the tensile stress.

FIG. 15 shows strains which are applied as the tensile stress and the compressive stress depending on a curvature radius. In FIG. 15, the horizontal axis indicates the curvature radius, and the vertical axis indicates the strain.

When the curvature radius was 2 mm or less and the tensile stress was applied, no measurement was performed and no result is shown in FIG. 15. The reasons for no result shown in FIG. 15 may be varied. For example, if a layer was extended and thus disconnected, no result is shown and such even is shown as "Fail" in FIG. 15. In other words, in a test of FIG. 15, the applied strain was suddenly increased in applying the compressive stress rather than in applying the tensile stress, and a defect was generated in a corresponding layer due to the tensile stress. In the test of FIG. 15, when the tensile stress is suddenly increased, a defect was generated where the curvature radius is 2 mm or less and therefore the strain was not measured.

Therefore, in one or more exemplary embodiment according to the invention, even when the organic light emitting display device is bent, the characteristic thereof is less changed, thereby reducing or effectively preventing deterioration of display quality thereof by applying the compressive stress to a layer including an inorganic material or a layer at which a thin film transistor is disposed and to which the tensile stress is less applied or not applied.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting display device comprising:
    an organic light emitting display panel which is curved and defined by:
        a flexible substrate,
        a thin film transistor layer comprising a semiconductor layer,
        an organic light emission layer comprising an organic light emitting material, and
        an encapsulation layer which covers the organic light emission layer; and
    a protective film layer which is disposed on an outer surface of the curved organic light emitting display panel, the protective film layer comprising:
        a first protective film disposed at a first side of the curved organic light emitting display panel; and
        a second protective film disposed at a second side of the curved organic light emitting display panel opposite to the first side thereof,
    wherein with the first and second protective films on the curved organic light emitting display panel,
        a neutral plane in which a compressive stress and a tensile stress maintain equilibrium is disposed in one of the first and second protective films to apply the compressive stress to the thin film transistor layer, and
        from the thin film transistor layer to which the compressive stress is applied, a distance to an outer surface of the one of the first and second protective films in which the neutral plane is disposed, is greater than a distance to an outer surface of the other one of the first and second protective films.

2. The organic light emitting display device of claim 1, wherein in the curved organic light emitting display panel on which the curved protective film layer is disposed having the neutral plane defined therein, the flexible substrate or the organic light emission layer receives the compressive stress.

3. The organic light emitting display device of claim 1, wherein the protective film layer further comprises:
    a first adhesive layer which is between the first protective film and the organic light emitting display panel and attaches the first protective film to the organic light emitting display panel.

4. The organic light emitting display device of claim 3, wherein the first protective film or the first adhesive layer receives the compressive stress.

5. The organic light emitting display device of claim 3, wherein the protective film layer further comprises:
a second adhesive layer which is between the second protective film and the organic light emitting display panel and attaches the second protective film to the organic light emitting display panel.

6. The organic light emitting display device of claim 5, wherein the second protective film or the second adhesive layer receives the compressive stress.

7. The organic light emitting display device of claim 1, wherein
the thin film transistor layer comprises a thin film transistor comprising the semiconductor layer,
the thin film transistor receives the compressive stress, and
the thin film transistor layer is between the organic light emission layer and the flexible substrate.

8. The organic light emitting display device of claim 7, wherein the organic light emission layer receives the compressive stress.

9. The organic light emitting display device of claim 1, wherein the encapsulation layer receives the compressive stress.

10. The organic light emitting display device of claim 1, wherein the organic light emitting display panel further comprises a barrier layer between the flexible substrate and the thin film transistor layer.

11. The organic light emitting display device of claim 10, wherein, the barrier layer receives the compressive stress.

12. The organic light emitting display device of claim 1, wherein the organic light emitting display panel further comprises an insulating layer comprising an inorganic material.

13. The organic light emitting display device of claim 12, wherein the organic light emitting display panel further comprises an organic insulating layer comprising an organic material.

14. The organic light emitting display device of claim 13, wherein the organic insulating layer receives the compressive stress.

15. The organic light emitting display device of claim 1, wherein
the thin film transistor layer which receives the compressive stress comprises a thin film transistor comprising the semiconductor layer, and
an entirety of the thin film transistor layer comprising the thin film transistor is at a same side of the neutral plane defined in the one of the first and second protective films.

16. An organic light emitting display device comprising:
an organic light emitting display panel which is curved and defined by:
a flexible substrate,
a thin film transistor layer comprising a semiconductor layer,
an organic light emission layer comprising an organic light emitting material, and
an encapsulation layer which covers the organic light emission layer; and
a protective film layer which is disposed on an outer surface of the curved organic light emitting display panel, the protective film layer comprising:
a first protective film disposed at a first side of the curved organic light emitting display panel; and
a second protective film disposed at a second side of the curved organic light emitting display panel opposite to the first side thereof,
wherein with the first and second protective films on the curved organic light emitting display panel,
a neutral plane in which a compressive stress and a tensile stress maintain equilibrium is disposed in one of the first and second protective films to apply the compressive stress to the thin film transistor layer, and
a thickness of the one of the first and second protective films in which the neutral plane is disposed, is greater than a thickness of the other one of the first and second protective films.

17. The organic light emitting display device of claim 16, wherein the thickness of the one of the first and second protective films in which the neutral plane is disposed, is about two times greater than the thickness of the other one of the first and second protective films.

18. The organic light emitting display device of claim 16, wherein the thickness of the one of the first and second protective films in which the neutral plane is disposed, is about three times greater than the thickness of the other one of the first and second protective films.

* * * * *